United States Patent
Chan et al.

(10) Patent No.: US 6,920,471 B2
(45) Date of Patent: Jul. 19, 2005

(54) COMPENSATION SCHEME FOR REDUCING DELAY IN A DIGITAL IMPEDANCE MATCHING CIRCUIT TO IMPROVE RETURN LOSS

(75) Inventors: Wing K. Chan, Allen, TX (US); Joseph T. Nabicht, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 652 days.

(21) Appl. No.: 10/123,677

(22) Filed: Apr. 16, 2002

(65) Prior Publication Data

US 2003/0195909 A1 Oct. 16, 2003

(51) Int. Cl.[7] .............................................. G06F 17/10
(52) U.S. Cl. ...................................................... 708/300
(58) Field of Search ................................ 708/300, 319

(56) References Cited

U.S. PATENT DOCUMENTS

| | | | | |
|---|---|---|---|---|
| 4,677,671 A | * | 6/1987 | Galand et al. | .............. 704/212 |
| 4,720,861 A | * | 1/1988 | Bertrand | ..................... 704/222 |
| 4,790,015 A | * | 12/1988 | Callens et al. | .............. 704/212 |
| 4,860,317 A | * | 8/1989 | Tomlinson | .................. 375/285 |
| 6,047,254 A | * | 4/2000 | Ireton et al. | ................. 704/209 |
| 2003/0074192 A1 | * | 4/2003 | Choi et al. | ................... 704/219 |
| 2004/0102967 A1 | * | 5/2004 | Furuta et al. | ............... 704/226 |

* cited by examiner

Primary Examiner—Tan V. Mai
(74) Attorney, Agent, or Firm—Abdul Zindani; W. James Brady, III; Frederick J. Telecky, Jr.

(57) ABSTRACT

A simple, power efficient and inexpensive digital compensation scheme for reducing delay in a digital impedance matching circuit to improve return loss. The scheme employs a digital filter to compensate for the absolute sampling and digital delays associated with a digital impedance matching circuit. The digital filter is based on the low-pass function of a DAC response, and can easily be modified to correct for not only the DAC response delay, but also other delays in the digital impedance matching circuit. The digital filter is very simple to implement and can add or subtract delays from the overall system.

21 Claims, 3 Drawing Sheets

COMPENSATION SCHEME FOR REDUCING DELAY IN A DIGITAL IMPEDANCE MATCHING CIRCUIT TO IMPROVE RETURN LOSS

BACKGROUND OF THE INVENTION

1. Field of the Invention

This invention relates generally to impedance matching circuits, and more particularly, to a digital compensation scheme for reducing delay in a digital impedance matching circuit to improve return loss.

2. Description of the Prior Art

Impedance matching is a critical function for telephone equipment. The trend for telephone line impedance matching has been from hybrid transformer to discrete opamp circuits, to integrated analog/digital implementations used to synthesize the required matching impedance.

Digital implementations of impedance matching networks are problematic due to the delay(s) through the digital processor(s). These delays cause a phase difference between the incident and synthesized signals which results in an amplitude difference that worsens the Return Loss. This problem is generally alleviated by using a faster, but more costly and higher power consuming digital converter and processor.

In view of the foregoing, it would be desirable and advantageous to provide a simple, power efficient and inexpensive digital compensation scheme for reducing delay in a digital impedance matching circuit to improve return loss.

SUMMARY OF THE INVENTION

The present invention is directed to a simple, power efficient and inexpensive digital compensation scheme for reducing delay in a digital impedance matching circuit to improve return loss. The scheme employs a digital filter to compensate for the absolute sampling and digital delays associated with a digital impedance matching circuit. The digital filter is based on the low-pass function of a DAC response, and can easily be modified to correct for not only the DAC response delay, but also other delays in the digital impedance matching circuit. This digital filter is very simple to implement and can add or subtract delays from the overall system.

In one aspect of the invention, a digital compensation scheme for reducing delay in a digital impedance matching circuit to improve return loss is implemented to allow for correction of delays which could compromise performance of an impedance matching system.

In another aspect of the invention, an all-digital compensation scheme is implemented for reducing delay in a digital impedance matching circuit to improve return loss.

In yet another aspect of the invention, a digital compensation scheme for reducing delay in a digital impedance matching circuit to improve return loss is implemented without use of high order filters.

In still another aspect of the invention, a digital compensation scheme for reducing delay in a digital impedance matching circuit to improve return loss is implemented to correct for phase lag in voice band codecs to provide better impedance matching.

In still another aspect of the invention, a small, integratable, all-digital compensation scheme is user adjustable to implement different compensation scenarios for reducing delay in a digital impedance matching circuit to improve return loss.

One embodiment of the invention is directed to a digital impedance matching circuit delay compensation system comprising a low-order, low-pass filter cascaded with an inverse DAC filter, wherein each filter is characterized by a respective transfer function having selectable coefficients such that the delay compensation system operates to reduce delays associated with a digital impedance matching circuit to improve return loss.

Another embodiment of the invention is directed to a phase delay compensation system comprising filtering means for digitally passing a low frequency signal; and an inverse DAC filter configured to process the filtered low frequency signal, wherein the delay compensation system is characterized by a plurality of transfer functions having selectable coefficients such that the delay compensation system operates to reduce static delays associated with a digital impedance matching circuit to improve return loss.

Still another embodiment of the invention is directed to a method of compensating a digital impedance matching circuit to improve return loss comprising the steps of providing a phase delay compensation system having means for digitally filtering a low frequency signal and an inverse DAC filter configured to process the filtered low frequency signal; placing the phase delay compensation system into a desired digital impedance matching circuit; and setting transfer function coefficients associated with the digital filtering means and the inverse DAC filter such that the delay compensation system operates to reduce static delays associated with the digital impedance matching circuit to improve return loss.

BRIEF DESCRIPTION OF THE DRAWINGS

Other aspects, features and advantages of the present invention will be readily appreciated, as the invention becomes better understood by reference to the following detailed description, when considered in connection with the accompanying drawing figures wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

The embodiments described herein below are directed to techniques including structures and methods for correcting the phase delay through a digital impedance matching system. These techniques allow digital circuits to synthesize a more accurate matching impedance to improve return loss. It will also be shown that the return loss of a system is dependent on both the amplitude matching and also the delay in the system. Even if the amplitude of the return signal is matched correctly to the incident signal therefore, a significant delay in the signal will cause a significant degradation in the return loss.

The return loss can be affected by a phase difference between the incident and reflected voltages, which translates to reactive differences in the line impedance and the matching impedance. For a given return loss then, there will be a specific phase difference. The amplitude variation and the phase variation must be kept to a minimum on all components to ensure an effective impedance matching circuit. The amplitude variation is fairly easy to control with gain and filter settings. Digital processing of the input signal to synthesize a matching impedance however, requires some finite amount of time. This delay in time or phase angle will result in an amplitude mismatch that translates directly into a worse return loss number. One way to lessen the phase difference is to correct for any phase delay caused by sampling and digital filters.

Figure 1A:
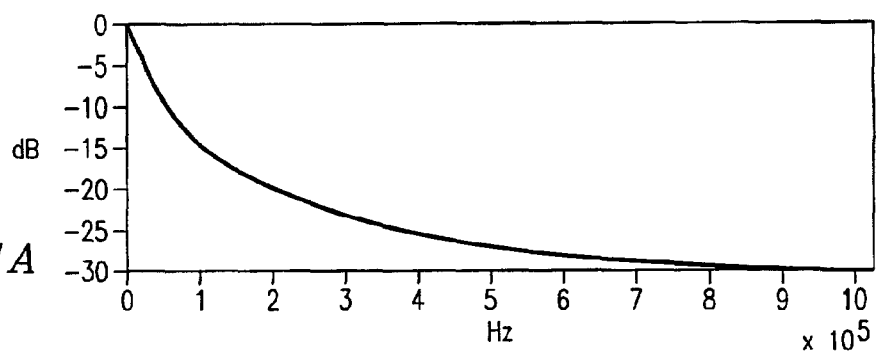
FIG. 1 illustrates amplitude and phase response plots for a DAC low pass filter.
Figure 1B:
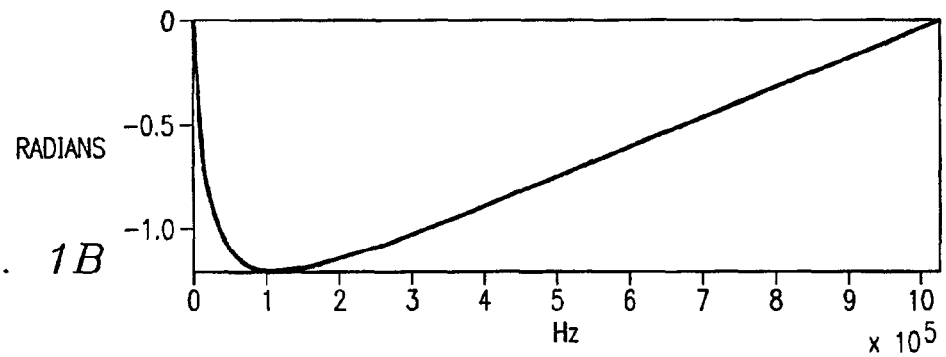

One phase delay compensation circuit may be implemented using the inverse of the low pass response of the Digital to Analog Converter (DAC). This DAC low pass function is generally implemented using a bank of switched capacitors for performing the digital to analog conversion and also for removing some of the high frequency images. The DAC low pass function may be a filter, for example, with a transfer function such as $$H(z) = \frac{K}{A - Bz^{-1}} \quad (1)$$

where values for K, A and B can arbitrarily be chosen, for example, to emulate a real DAC operating at 2.048E6 Hz. In this case, K=1.1248, A=18.755 and B=17.63. The frequency and phase response associated with this DAC low pass filter are illustrated in FIG. 1. From the phase response shown in the lower plot, it can be seen there is a significant phase delay as indicated by the steep negative phase plot in the low frequency voice band; wherein the phase delay can be determined by looking at the phase divided by the frequency.

Any DAC amplitude and phase changes can be fully corrected theoretically by applying the inverse of the DAC low pass function. In the case described above with reference to FIG. 1, the inverse filter is a simple high pass Finite Impulse Response (FIR) filter defined as $$H(z)^{-1} = \frac{A - Bz^{-1}}{K} = C - Dz^{-1} \quad (2)$$

Figure 2A:
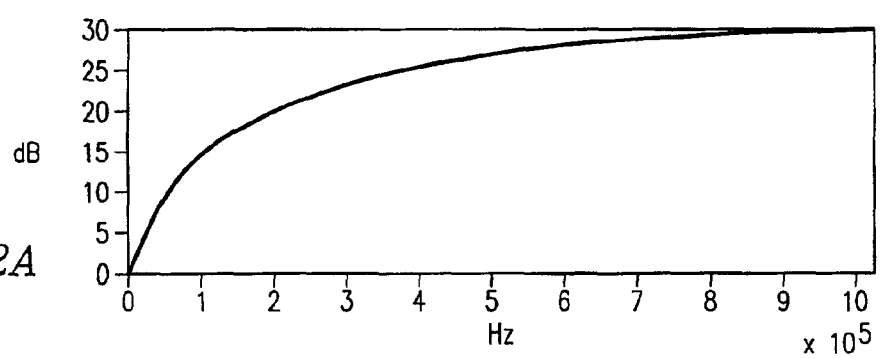
FIG. 2 illustrates amplitude and phase response plots for an inverse DAC low pass filter.
Figure 2B:
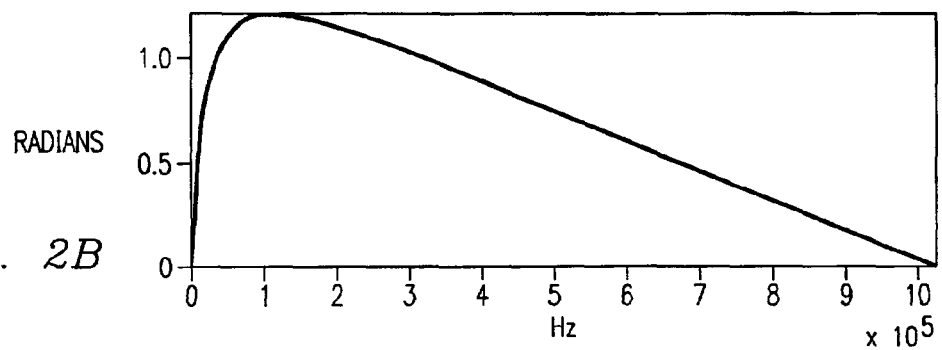

The frequency and phase response of the high pass FIR filter defined by equation (2) are illustrated in FIG. 2. An examination of the plots depicted in FIGS. 1 and 2 reveals that the cascaded response of the two filters would be 1.

The positive phase of the inverse filter provides some phase advancement (i.e. output predictive circuit) which predicts the next output value before it occurs. When this is combined with the exact negative phase of the DAC low pass filter, the result is a 0 phase response and a completely delay-corrected output signal. The present inventors have found that although this approach works in theory, the high gain of the inverse filter at higher frequencies can pose a problem for any high frequency noise components that exist in real systems, and that this is especially true for quantizer bit noise. A high frequency gain of over 30 dB, for example, will cause a real system to clip and compromise the Signal to Noise Ratio (SNR).

The present inventors found the foregoing problems could be solved by cascading the inverse filter with a simple low-order, low pass filter with a fairly wide bandwidth. This structure will then control the gain of the higher frequency bands by providing further attenuation for high frequency noise. This filter will however, add a small delay, but the inventors found that the small additional delay could be compensated for by adjusting the inverse filter response.

The present inventors also found that by varying the values of C and D, the high pass corner of the inverse filter could be scaled in the frequency domain. This will then scale the slope of the positive phase response of the inverse filter to provide the proper compensation for the extra delay of the cascaded low pass filter. The values can then be arbitrarily chosen to achieve any desired realizable magnitude and phase response. With continued reference to FIGS. 1 and 2, and equations (1) and (2) discussed herein before, the inverse filter was simply the inverse of the DAC low pass filter, and was magnitude scaled to provide the desired phase response in order to match the DAC low pass filter. It can be seen from FIG. 2 however, that the phase slope of the inverse filter eventually becomes 0 and starts to become negative. This characteristic demonstrates that this filter scheme for delay correction is only good up to the frequency when the slope becomes negative (i.e. adds time delay), and that the predictive nature of the filter is limited up to that frequency. This filter scheme is perfectly fine as the phase slope transition frequency is well above about 4 kHz (closer to 100 kHz), and the slope in the voice band is almost linear regarding voice band codecs.

Figure 3:
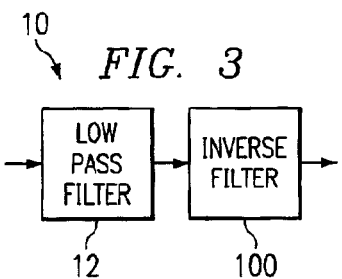
FIG. 3 is a simplified block diagram illustrating a compensation scheme having a low pass filter cascaded with an inverse DAC filter to control high frequency gain according to one embodiment of the present invention.

FIG. 3 is a simplified block diagram illustrating a compensation scheme 10 having a low pass filter 12 cascaded with an inverse DAC filter 100 to control high frequency gain according to one embodiment of the present invention. The inverse DAC filter 100 is a simple FIR filter; and its operation is described herein below with reference to FIGS. 4 and 5.

Figure 4:
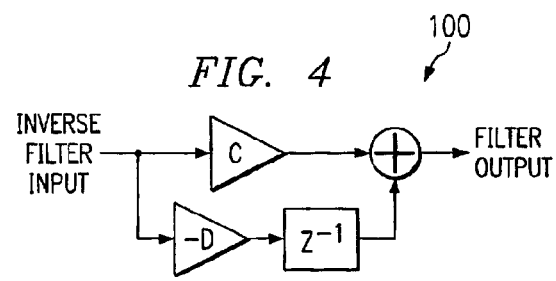
FIG. 4 is a more detailed block diagram illustrating the structure of the inverse DAC filter shown in FIG. 3 according to one embodiment of the present invention.
Figure 5:
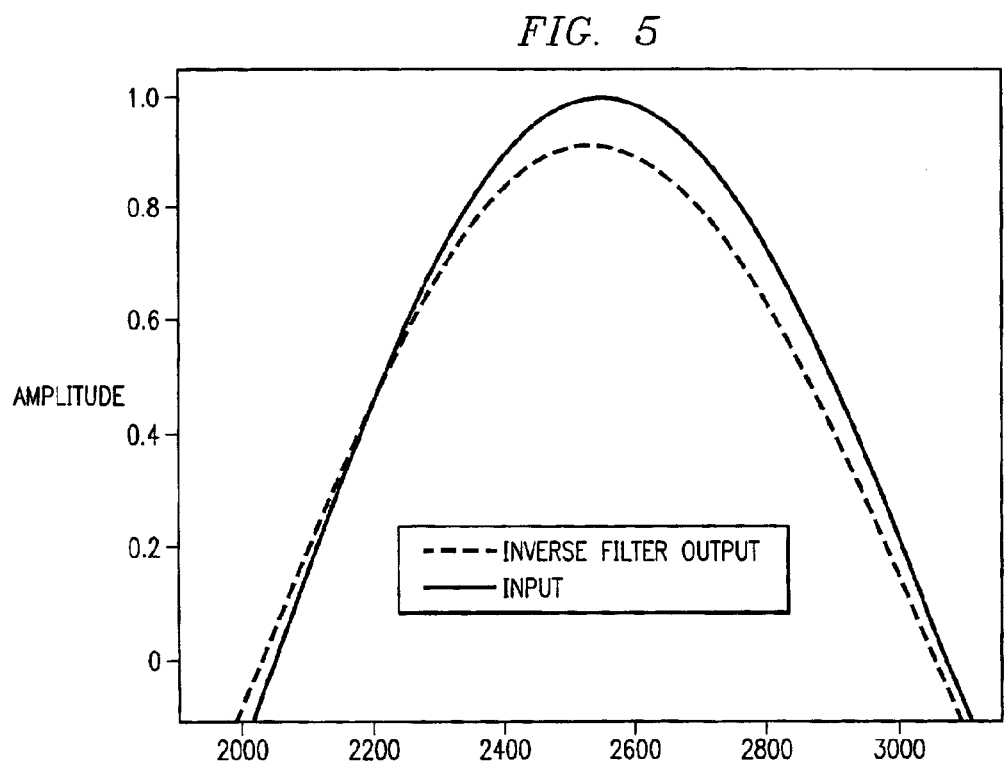
FIG. 5 is a plot diagram illustrating input and output signals for the inverse DAC filter shown in FIG. 4.

FIG. 4 is a more detailed block diagram illustrating the structure of the inverse DAC filter 100 shown in FIG. 3 according to one embodiment of the present invention. The inverse DAC filter 100 has a transfer function defined by equation (2). A plot of the input signal and the output signal shown in FIG. 5 reveals that the output of the inverse filter 100 occurs before the input to the inverse filter 100. Although this appears to break the rules regarding causality, it does not. This is because the filter 100 is in essence predicting the output signal based on the previous input sample. The amplitude has been altered a bit, but this can be corrected in the filter coefficients of the digital impedance matching circuit or the low pass filter 12.

Figure 6A:
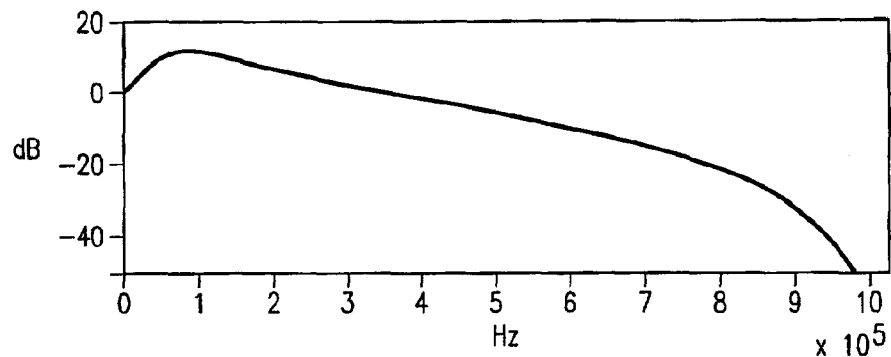
FIG. 6 are plot diagrams illustrating the response of the combined low pass filter and inverse DAC filter shown in FIGS. 3–6.
Figure 6B:
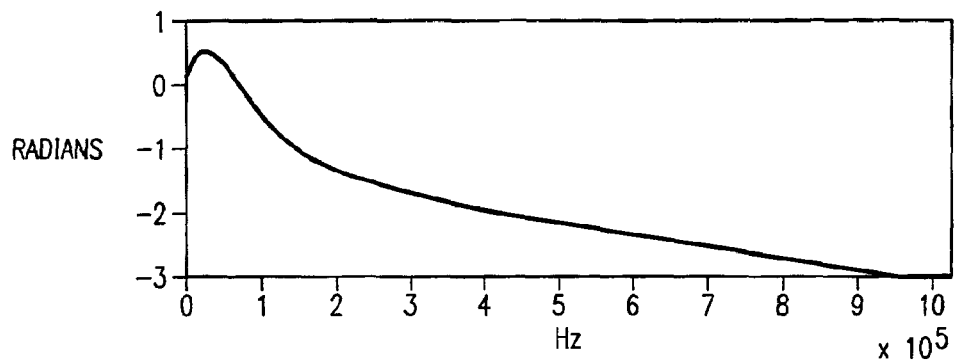

The present inventors also found the low pass filter 12 can be any desired low pass filter. One embodiment described herein below employed a $2^{nd}$ order Chebyshev filter with a ripple of 0.1 dB and a corner frequency at 50 kHz. The combination of the 2$^{nd}$ order Chebyshev low pass filter and the inverse DAC filter 100 was found to provide the frequency response shown in FIG. 6.

Many other fixed processing delays exist in a digital impedance matching system which may also be corrected simply by adjusting the inverse DAC filter 100 coefficients to achieve the proper phase slope to correct for all of these static delays. These other static delays include the fixed Anti-Alias Filter (AAF) delay, Analog to Digital Converter (ADC) delays, digital impedance synthesis filter, and the image reject filter (IRF) on the output of the DAC low pass filter 12.

Figure 7:
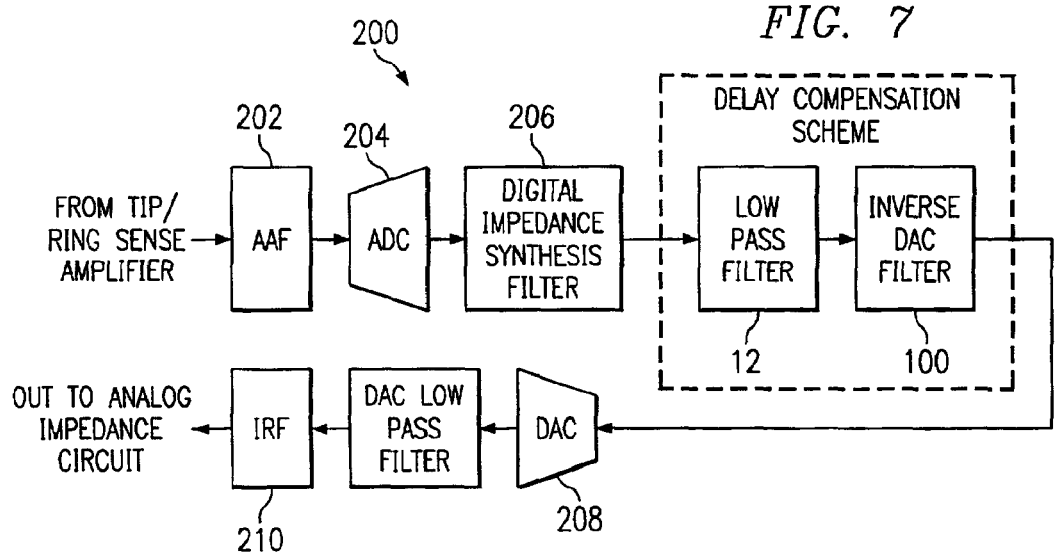
FIG. 7 is a system level block diagram illustrating all the static delays in a digital impedance matching system, and the placement of the delay compensation scheme shown in FIG. 3 according to one embodiment of the present invention.

FIG. 7 is a system level block diagram illustrating all the static delays in a digital impedance matching system 200, and the placement of the delay compensation scheme shown in FIG. 3 according to one embodiment of the present invention. The AAF 202 is a fixed wide bandwidth filter used to band limit the signal before the ADC 204 to eliminate aliases in the ADC 204. The Digital Impedance Synthesis Filter 206 is used to emulate the frequency response of the impedance matching network 200. The Low Pass Filter 12 is used to attenuate any high frequency noise such that the large gains in the high frequency band of the Inverse DAC Filter 100 will not cause any clipping. The Inverse DAC Filter 100 is used to correct for delays in the DAC 208 and other static delays in the system 200. The IRF 210 is an image reject filter that is used to reject the DAC 208 sampling images.

In summary explanation, a simple, power efficient and inexpensive digital compensation scheme is implemented for reducing delay in a digital impedance matching circuit to improve return loss. The scheme employs a digital filter to compensate for the absolute sampling and digital delays associated with a digital impedance matching circuit. The digital filter is based on the low-pass function of a DAC response, and can easily be modified to correct for not only the DAC response delay, but also other delays in the digital impedance matching circuit. The digital filter is very simple to implement and can add or subtract delays from the overall system.

Although the idea of phase and amplitude compensation is not new, the present invention described with reference to particular embodiments set forth herein before provides the first application of such concepts to improve digital impedance synthesis schemes. Known equalization schemes associated with other systems have been generally more concerned with phase equalization, where the phase response is modified to be linear over frequency, i.e. same delay. In contradistinction, the present invention implements phase correction circuits to actually reduce the overall signal delay.

In view of the above, it can be seen the present invention presents a significant advancement in the art of digital impedance matching circuits and systems. In view of the foregoing descriptions, it should be apparent that the present invention also represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A digital impedance matching circuit delay compensation system comprising:
    a low-order low pass filter cascaded with an inverse DAC filter, wherein each filter is characterized by a respective transfer function having selectable coefficients such that the delay compensation system operates to reduce delays associated with a digital impedance matching circuit to improve return loss.

2. The delay compensation system according to claim 1 wherein the inverse DAC filter is an FIR filter.

3. The delay compensation system according to claim 1 wherein the inverse DAC filter is configured to provide a predicted output signal based on a previous input sample.

4. The delay compensation system according to claim 1 wherein the low-order low-pass filter is characterized by a transfer function defined by $$H(z) = \frac{K}{A - Bz^{-1}}.$$

5. The delay compensation system according to claim 1 wherein the inverse DAC filter is characterized by a transfer function defined by $$H(z)^{-1} = \frac{A - Bz^{-1}}{K} = C - Dz^{-1}.$$

6. The delay compensation system according to claim 1 wherein the inverse DAC filter is characterized by transfer function coefficients that are selectable to configure the inverse DAC filter to correct a plurality of static delays associated with an impedance matching circuit.

7. The delay compensation system according to claim 6 wherein the plurality of static delays are selected from the group consisting of a fixed anti-alias filter delay, an ADC delay, a digital impedance synthesis filter delay, a DAC delay, and an image reject filter delay.

8. The delay compensation system according to claim 1 wherein the low-pass filter is characterized by transfer function coefficients that are selectable to configure the low-pass filter to attenuate any high frequency noise such that large gains in the high frequency band of the inverse DAC filter will not cause signal clipping.

9. The delay compensation system according to claim 1 further comprising:
    an anti-alias filter in communication with a tip/ring sense amplifier to generate an output signal;
    an ADC operational to receive the anti-alias filter output signal and generate an ADC output signal;
    a digital impedance synthesis filter operational to receive the ADC output signal and generate an input signal to the low-order low-pass filter;
    a DAC operational to receive a signal generated by the inverse DAC filter;
    a DAC low-pass filter operational to receive a signal generated by the DAC in response to the signal generated by the inverse DAC filter; and
    an image reject filter operational to receive a signal generated by the DAC and generate an input signal to an analog impedance circuit.

10. The delay compensation system according to claim 1 wherein the low-order low-pass filter is a digital filter.

11. The delay compensation system according to claim 1 wherein the delay compensation system is devoid of purely analog devices.

12. A phase delay compensation system comprising:
    filtering means for digitally passing a low frequency signal; and
    an inverse DAC filter configured to process the filtered low frequency signal, wherein the delay compensation system is characterized by a plurality of transfer functions having selectable coefficients such that the delay compensation system operates to reduce static delays associated with a digital impedance matching circuit to improve return loss.

13. The phase delay compensation system according to claim 12 wherein the filtering means is a low-order, low-pass filter.

14. The delay compensation system according to claim 13 wherein the low-order low-pass filter is characterized by a transfer function defined by $$H(z) = \frac{K}{A - Bz^{-1}}.$$

15. The phase delay compensation system according to claim 12 wherein the inverse DAC filter is an FIR filter.

16. The phase delay compensation system according to claim 15 wherein the inverse DAC filter is characterized by a transfer function defined by $$H(z)^{-1} = \frac{A - Bz^{-1}}{K} = C - Dz^{-1}.$$

17. The phase delay compensation system according to claim 12 wherein the inverse DAC filter is configured to provide a predicted output signal based on a previous input sample.

18. The phase delay compensation system according to claim 12 wherein the inverse DAC filter is characterized by transfer function coefficients that are selected to configure the inverse DAC filter to correct a plurality of static delays associated with an impedance matching circuit.

19. The phase delay compensation system according to claim 18 wherein the plurality of static delays are selected from the group consisting of a fixed anti-alias filter delay, an ADC delay, a digital impedance synthesis filter delay, a DAC delay, and an image reject filter delay.

20. The phase delay compensation system according to claim 12 wherein the filtering means is characterized by transfer function coefficients that are selected to configure a low-order, low-pass filter to attenuate any high frequency noise such that large gains in the high frequency band associated with the inverse DAC filter will not cause signal clipping.

21. A method of compensating a digital impedance matching circuit to improve return loss comprising the steps of:

providing a phase delay compensation system having means for digitally filtering a low frequency signal and an inverse DAC filter configured to process the filtered low frequency signal;

placing the phase delay compensation system into a desired digital impedance matching circuit; and setting transfer function coefficients associated with the digital filtering means and the inverse DAC filter such that the delay compensation system operates to reduce static delays associated with the digital impedance matching circuit to improve return loss.

* * * * *